(12) United States Patent
Rigney et al.

(10) Patent No.: US 6,620,525 B1
(45) Date of Patent: Sep. 16, 2003

(54) THERMAL BARRIER COATING WITH IMPROVED EROSION AND IMPACT RESISTANCE AND PROCESS THEREFOR

(75) Inventors: Joseph David Rigney, Milford, OH (US); Ramgopal Darolia, West Chester, OH (US)

(73) Assignee: General Electric Company, Schenectady, NY (US)

( * ) Notice: Subject to any disclaimer, the term of this patent is extended or adjusted under 35 U.S.C. 154(b) by 18 days.

(21) Appl. No.: 09/710,682

(22) Filed: Nov. 9, 2000

(51) Int. Cl.[7] ............................. B32B 15/04; F03B 3/12
(52) U.S. Cl. ...................... 428/633; 428/632; 428/469; 428/336; 428/323; 428/328; 428/699; 428/701; 428/702; 416/241 B
(58) Field of Search ..................... 428/632, 633, 428/469, 336, 323, 328, 699, 701, 702; 416/241 B, 241 R

(56) References Cited

U.S. PATENT DOCUMENTS

| | | | |
|---|---|---|---|
| 4,112,137 A | | 9/1978 | Zega |
| 4,774,150 A | | 9/1988 | Amano et al. |
| 4,996,117 A | | 2/1991 | Chu et al. |
| 5,080,977 A | * | 1/1992 | Zaplatysky |
| 5,296,274 A | | 3/1994 | Movchan et al. |
| 5,418,003 A | | 5/1995 | Bruce et al. |
| 5,474,809 A | | 12/1995 | Skelly et al. |
| 5,512,382 A | | 4/1996 | Strangman |
| 5,562,998 A | | 10/1996 | Strangman |
| 5,683,825 A | * | 11/1997 | Bruce et al. |
| 5,773,078 A | | 6/1998 | Skelly |
| 5,834,070 A | | 11/1998 | Movchan et al. |
| 6,306,517 B1 | * | 10/2001 | Gray et al. |
| 6,482,537 B1 | * | 11/2002 | Strangman et al. |

* cited by examiner

Primary Examiner—Deborah Jones
Assistant Examiner—Jennifer McNeil
(74) Attorney, Agent, or Firm—David L. Narciso; Gary M. Hartman; Domenica N. S. Hartman

(57) ABSTRACT

A multilayer thermal barrier coating (TBC) and method for forming the coating on a component intended for use in a hostile environment. The coating includes layers of particle-free yttria-stabilized zirconia alternating with layers of yttria-stabilized zirconia containing at least three volume percent up to about fifty volume percent of alumina and/or chromia particles and/or precipitates. In the form of particles and/or precipitates in these amounts, sufficient alumina and/or chromia is present to significantly increase the impact and wear resistance of the coating while avoiding discrete and homogeneous layers of alumina and/or chromia and abrupt compositional interfaces that increase the incidence of spallation.

17 Claims, 2 Drawing Sheets

THERMAL BARRIER COATING WITH IMPROVED EROSION AND IMPACT RESISTANCE AND PROCESS THEREFOR

FIELD OF THE INVENTION

This invention relates to protective coatings for components exposed to high temperatures, such as the hostile thermal environment of a gas turbine engine. More particularly, this invention is directed to a multilayer thermal barrier coating (TBC) with improved erosion and impact resistance as a result of alternating layers of the TBC containing alumina and/or chromia particles or precipitates.

BACKGROUND OF THE INVENTION

Higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, such alloys alone are often susceptible to thermal damage and oxidation and hot corrosion attack, and may not retain adequate mechanical properties. For this reason, these components are often protected by a thermal barrier coating (TBC) system. TBC systems typically include an environmentally-protective bond coat and a thermal-insulating ceramic topcoat, typically referred to as the TBC. Bond coat materials widely used in TBC systems include overlay coatings such as MCrAlX (where M is iron, cobalt and/or nickel, and X is yttrium or another rare earth element), and diffusion coatings such as diffusion aluminides that contain aluminum intermetallics.

Ceramic materials and particularly binary yttria-stabilized zirconia (YSZ) are widely used as TBC materials because of their high temperature capability, low thermal conductivity, and relative ease of deposition by plasma spraying, flame spraying and physical vapor deposition (PVD) techniques. TBC's employed in the highest temperature regions of gas turbine engines are often deposited by electron beam physical vapor deposition (EBPVD), which yields a columnar, strain-tolerant grain structure that is able to expand and contract without causing damaging stresses that lead to spallation of the TBC. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.). While YSZ coatings are widely employed in the art for their desirable thermal and adhesion characteristics, they are susceptible to thinning from mechanical damage during engine operation, particularly from impact and erosion by hard particles in the high velocity gas path. Impact damage and the resulting loss of TBC particularly occur along the leading edges of components such as turbine blades, while erosion is more prevalent on the concave surfaces of the blades. Both forms of mechanical damage not only shorten component life, but also lead to reduced engine performance and fuel efficiency. Though mechanical damage such as erosion can be addressed by increasing the thickness of the TBC, a significant drawback is an increase in thermal stresses within the coating, leading to a higher incidence of spallation. Consequently, other solutions are necessary to achieve an impact and erosion-resistant TBC with an acceptable thickness, preferably less than 250 micrometers.

Various attempts to produce more impact and erosion-resistant TBC's for gas turbine engines have been directed to thermally treating the outer surface of the ceramic TBC material or providing an additional wear-resistant outer coating. Suggested materials for more wear-resistant outer coatings have included zircon ($ZrSiO_4$), silica ($SiO_2$), chromia ($Cr_2O_3$) and alumina ($Al_2O_3$) While various methods and apparatuses are capable of producing multilayered TBC by sequentially depositing layers of different materials, a difficulty has been a tradeoff between spallation resistance and thermal conductivity. Spallation resistance is generally reduced by the presence of abrupt compositional changes at the interfaces between layers. On the other hand, and as discussed in U.S. Pat. No. 5,792,521 to Wortman, if the interfaces between layers are characterized by localized compositional gradients containing mixtures of the different deposited materials, the interface offers a poorer barrier to thermal conduction as compared to a distinct compositional interface in which minimal intermixing exists. Though it is possible to employ low deposition rates and to physically reposition a component to be coated in order to ensure that discrete and homogeneous layers of minimal thickness are deposited, such a technique is impractical for mass-produced components such as turbine blades and nozzles of gas turbine engines.

Wortman discloses a method for depositing a multilayer TBC having alternating discrete and homogeneous layers, e.g., YSZ and alumina, by which compositional gradients are avoided. While the resulting TBC is characterized by lower thermal conductivity and enhanced resistance to spallation when subjected to erosion in the hostile thermal environment of a gas turbine engine, further improvements in TBC technology are desirable, particularly as TBC's are employed to thermally insulate components intended for more demanding engine designs.

BRIEF SUMMARY OF THE INVENTION

The present invention generally provides a thermal barrier coating (TBC) and method for forming the coating on a component intended for use in a hostile environment, such as the superalloy turbine, combustor and augmentor components of a gas turbine engine. The coating and method are particularly directed to a multilayer TBC that exhibits improved impact and erosion resistance as a result of being composed of discrete ceramic layers, each having a columnar grain structure. Improvements in impact and erosion resistance are notably evident with TBC's formed of yttria-stabilized zirconia (YSZ).

The invention generally entails a multilayer thermal barrier coating having layers of precipitate-free YSZ alternating with layers of YSZ containing at least 3 volume percent up to about 50 volume percent of alumina and/or chromia particles and/or precipitates. In the form of particles and/or precipitates in these amounts, sufficient alumina and/or chromia is present to significantly increase the impact and wear resistance of the TBC while avoiding the presence of localized compositional gradients that would decrease the spallation resistance of the TBC. The particles/precipitates of alumina and/or chromia harden the YSZ and, therefore, the entire TBC more effectively than discrete layers of alumina or chromia. Contrary to Wortman, the invention also avoids the presence of abrupt compositional interfaces between the alternating layers of the TBC, for the purpose of reducing the incidence of spallation attributable to abrupt and consequently weak interfaces between the dissimilar materials (YSZ and alumina and/or chromia).

A preferred method for depositing the multilayer TBC of this invention is physical vapor deposition techniques, such as EBPVD, by which the TBC and the particles and/or precipitates are formed by evaporating multiple ingots, at least one of which is YSZ while a second contains alumina and/or chromia and optionally YSZ. In this method, the alumina and/or chromia content of the second ingot is intermittently evaporated during the deposition process to produce the precipitate-containing YSZ layers. Alternatively, the TBC can be deposited by evaporating a single ingot containing YSZ and regions of alumina and/or chromia, the latter of which is only intermittently evaporated along with YSZ during the deposition process to yield the precipitate-containing YSZ layers. Another alternative is to evaporate a single ingot of YSZ using a chemical vapor deposition (CVD)-assisted process in which a source of aluminum vapors is introduced into the coating chamber, causing oxidation of the aluminum and deposition of the resulting alumina vapors along with YSZ. The alternating layers of precipitate-free and precipitate-containing YSZ can be deposited by pulsing the CVD source. Another alternative method is to use an ion beam source of aluminum and/or chromium (cathodic arc source) that can be switched on intermittently while evaporating a YSZ ingot to create alternating layers of precipitate-free and precipitate-containing YSZ. With each of the alternative methods, the evaporation process is scalable to allow for the use of multiple YSZ ingots or YSZ sources, while also incorporating alumina and/or chromia in intermediate layers.

The resulting TBC is characterized by improved resistance to both erosion and impact as a result of the alumina and/or chromia particles and/or precipitates being present in sufficient amounts within a YSZ matrix, and without being present as discrete layers or in amounts that would embrittle the TBC. As a result, the present invention allows for the use of a relatively thin TBC because the TBC is not required to be deposited to a thickness sufficient to allow for erosion rates typically seen with conventional YSZ TBC. The net benefit is improved component life, engine performance and fuel efficiency.

Other objects and advantages of this invention will be better appreciated from the following detailed description.

DETAILED DESCRIPTION OF THE INVENTION

Figure 1:
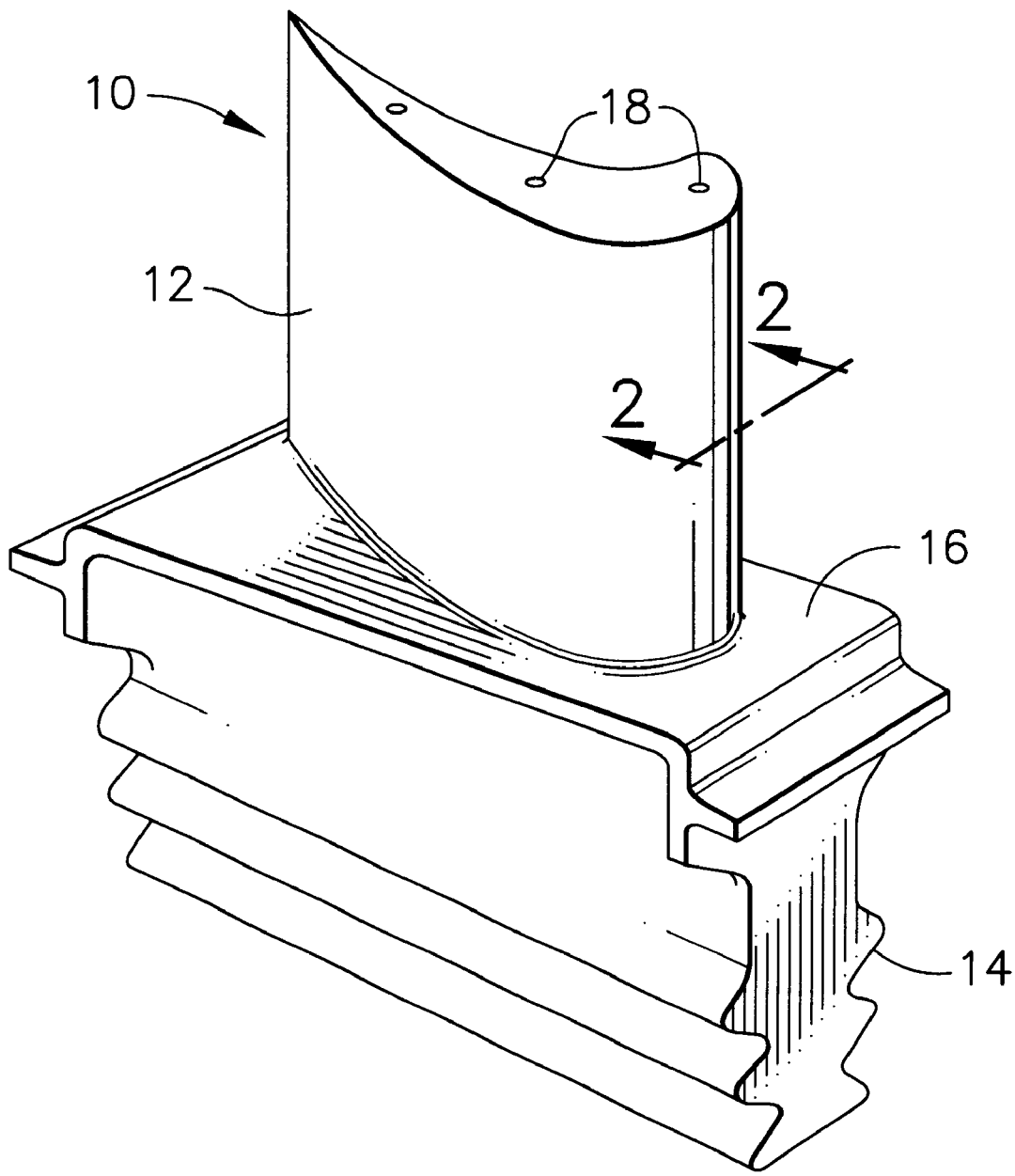
FIG. 1 is a perspective view of a high pressure turbine blade.

The present invention is generally applicable to components subjected to high temperatures, and particularly to components such as the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to hot combustion gases as well as attack by oxidation, corrosion and erosion. The airfoil 12 is protected from its hostile operating environment by a thermal barrier coating (TBC) system 20 schematically depicted in FIG. 2. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which a thermal barrier coating may be used to protect the component from a high temperature environment.

Figure 2:
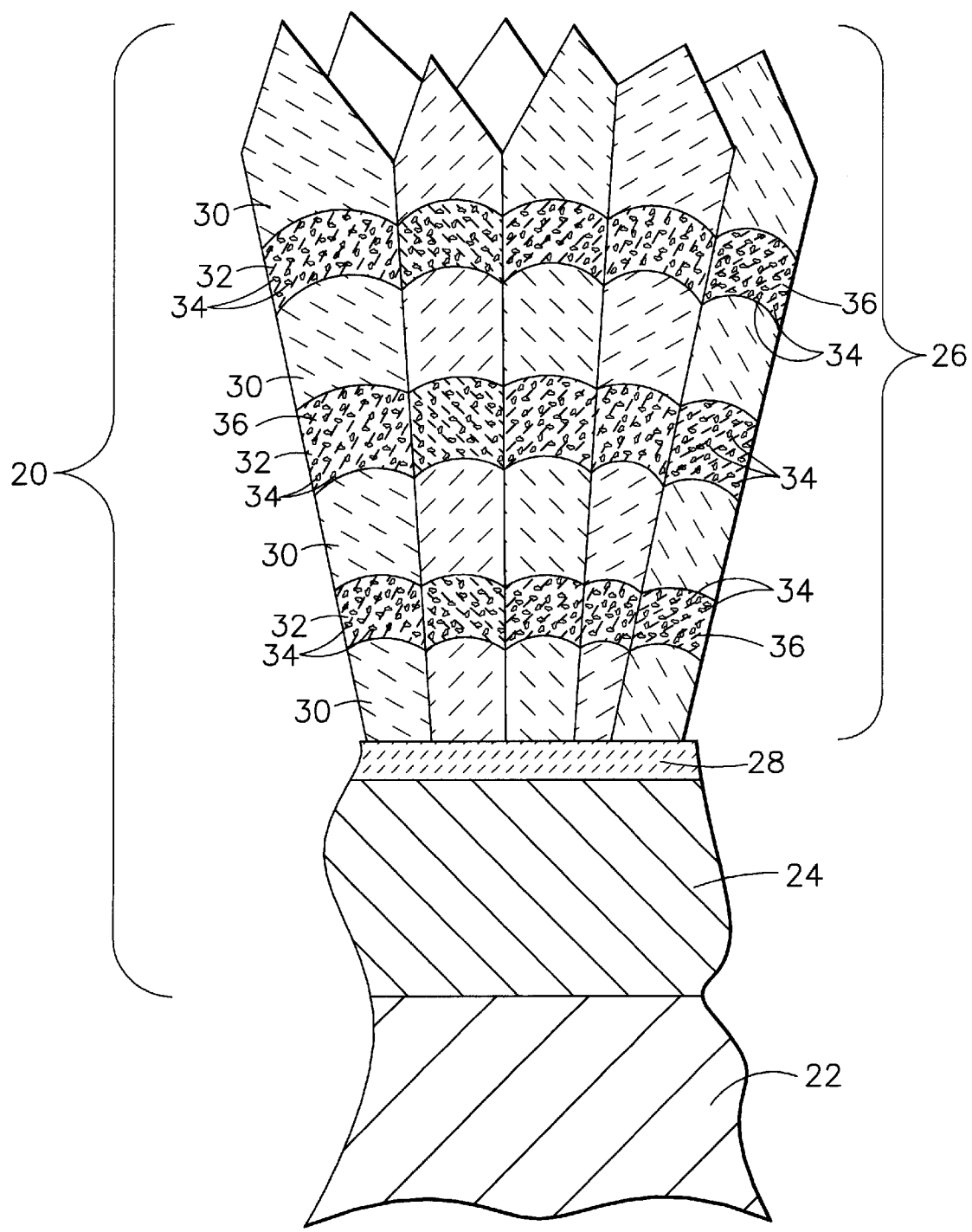
FIG. 2 is a cross-sectional view of the blade of FIG. 1 along line 2—2, and shows a thermal barrier coating system on the blade in accordance with this invention.

The TBC system 20 is represented in FIG. 2 as including a metallic bond coat 24 that overlies the surface of a substrate 22, the latter of which is typically a superalloy and the base material of the blade 10. As is typical with TBC systems for components of gas turbine engines, the bond coat 24 is an aluminum-rich composition, such as an overlay coating of an MCrAlX alloy or a diffusion coating such as a diffusion aluminide or a diffusion platinum aluminide, all of which are known in the art. Aluminum-rich bond coats of this type develop an adherent alumina scale 28 as a result of oxidation of the bond coat 24. The alumina scale 28 chemically bonds a thermal-insulating ceramic layer, hereinafter the TBC 26, to the bond coat 24 and substrate 22. The TBC 26 is deposited to a thickness that is sufficient to provide the required thermal protection for the underlying substrate 22 and blade 10, generally on the order of about 75 to about 300 micrometers.

As shown, the TBC 26 has a strain-tolerant columnar grain structure achieved by depositing the TBC 26 using a physical vapor deposition technique, such as EBPVD. The TBC 26 and its individual columnar grains are represented in FIG. 2 as having alternating discrete layers 30 and 32 of differing compositions. The layers 32 are shown as containing particles and/or precipitates 34 (hereinafter, referred to simply as particles) in a ceramic matrix 36, while the intervening layers 30 are formed essentially of the same material as the ceramic matrix 36. As will be discussed in greater detail below, the particles 34 are of a material that is harder than the ceramic matrix 36 for the purpose of promoting the overall impact and erosion resistance of the TBC 26. Though a particle-free layer 30 is shown as being deposited directly on the bond coat 24 while a second particle-free layer 30 is the outermost layer of the TBC, it is within the scope of this invention that a particle containing layer 32 could be the first and/or last deposited layer of the TBC 26. In addition, though a total of seven layers 30 and 32 are shown in FIG. 2, the TBC 26 could be composed of essentially any number of layers 30 and 32, within practical limitations for the total thickness desired for the TBC 26.

In a preferred embodiment, the layers 30 and the ceramic matrix 36 are an yttria-stabilized zirconia (YSZ), a preferred composition being about 3 to about 20 weight percent yttria. However, this invention is more generally applicable to TBC's formed by EBPVD in which the hardness of alternating layers of a ceramic material is increased by the inclusion within such layers of particles of a phase that is harder and/or has a higher elastic modulus than the ceramic material. As a result, other ceramics could be used as the matrix 36 for the TBC 26, including but not limited to yttria, nonstabilized zirconia, and zirconia partially or fully stabilized by magnesia, ceria, scandia or other oxides. In addition to having a hardness or elastic modulus greater than that of the matrix 36, the material for the particles 34 is limited by the requirement to be thermodynamically stable when in contact with the ceramic matrix 36 at temperatures to which the TBC 26 will be subjected.

According to the invention, the particles 34 within the layers 32 are alumina ($Al_2O_3$), chromia ($Cr_2O_3$) or a combination thereof, and are uniformly dispersed within the layers 32 of each grain of the thermal barrier coating 26. In the form of fine limited dispersions within alternating layers 32 of the TBC 26, the particles 34 successfully perform the function of promoting the overall impact and erosion resistance of the TBC 26 without discrete and homogeneous layers of alumina and/or chromia, and without creating abrupt compositional interfaces between the alternating layers 30 and 32 that would promote spallation attributable to weak (low-toughness) interfaces between the dissimilar TBC materials (YSZ and alumina and/or chromia).

To be effective, it is believed that the TBC 26 should comprise about 20 to about 80 volume percent of the particle-containing layers 32. While the thicknesses of the layers 32 can vary, a practical lower limit is about one micrometer and a suitable upper limit is about fifty micrometers, though it is foreseeable that thicker layers 32 could be employed. It is important that the relative volume and thicknesses of the particle-containing layers 32 are limited to avoid embrittling the TBC 26 and adversely affecting its mechanical properties. The particle-free layers 30 may have similar thicknesses, though greater thicknesses are preferred to reduce the overall volume fraction of the alumina/chromia particles 34 which, if the layers 30 and matrix 36 are formed of YSZ, have higher values of thermal conductivity.

It is believed that each of the particle-containing layers 32 must contain at least 3 volume percent of the particles 34 to contribute to the erosion and impact resistance of the layers 32 and the TBC 26 overall, but not more than 50 volume percent of the particles 34 so as not to unacceptably embrittle the layers 32. The particles 34 are preferably present in the layers 32 at levels of about 10 to about 40 volume percent, and have diameters on the order of about 100 to about 5000 nanometers, more preferably about 500 to about 2000 nanometers.

A suitable process of depositing the TBC 26 is a physical vapor deposition process, alone or assisted by chemical vapor deposition (CVD). A preferred process is believed to by EBPVD, which generally entails loading a component (such as the blade 10 of FIG. 1) to be coated into a coating chamber, evacuating the chamber, and then backfilling the chamber with oxygen and an inert gas such as argon to achieve a subatmospheric chamber pressure. The component is then supported in proximity to one or more ingots of the desired coating materials, and one or more electron beams are projected onto the ingot(s) so as to evaporate the ingot materials and produce a vapor that deposits (condenses) on the component surface. While similar in many respects to conventional EBPVD, the process for depositing the TBC 26 of this invention requires that each TBC coating material (YSZ, alumina and/or chromia) is the present within one or more of the ingots.

In a first embodiment, the TBC 26 is deposited by evaporating multiple ingots, at least one of which is formed of only YSZ while a second is formed of alumina and/or chromia, alone, mixed with YSZ or present as discrete regions within a YSZ ingot. In this embodiment, the YSZ ingot can be continuously evaporated to produce the particle-free YSZ layers 30 and the YSZ matrix of the particle-containing layers 32, while the second ingot is only intermittently evaporated to deposit alumina and/or chromia for the particle-containing layers 32.

Alternatively, a single ingot containing YSZ and regions of alumina and/or chromia can be evaporated to produce the TBC 26. In this case, the electron beam is rastered over the surface of the ingot so that the alumina/chromia regions are only intermittently evaporated while the remaining YSZ portion of the ingot is continuously evaporated throughout the deposition process. As a result, YSZ is continuously deposited to form the particle-free layers 30 and intermittently codeposited with alumina and/or chromia to form the YSZ matrix 36 of the particle-containing layers 32. Another alternative is to evaporate a single ingot of YSZ using a chemical vapor deposition (CVD)-assisted process in which a source of aluminum vapors is introduced into the coating chamber, causing oxidation of the aluminum and deposition of the resulting alumina vapors along with YSZ. The alternating layers of particle-free and particle-containing YSZ 30 and 32 are then deposited by pulsing the CVD source. Another alternative method is to use an ion beam source of aluminum and/or chromium (cathodic arc source) that can be switched on intermittently while evaporating a YSZ ingot to create the alternating layers 30 and 32.

For each of the above deposition processes, other process variables or fixturing, such as rotation and masking of a component, can be used to selectively deposit the TBC 26 of this invention on particular surface regions of the component that are relatively more prone to erosion or impact damage. For example, the TBC 26 with its alternating layers 30 and 32 could be selectively deposited on regions of the leading edge of the blade 10, while conventional YSZ TBC could be selectively deposited on other surface regions of the blade 10.

The deposition process of this invention is carried out so that alumina and/or chromia are evaporated and condense to form the discrete and fine particles 34 represented in FIG. 2. Because alumina and chromia are not soluble in YSZ, the particles 34 remain as discrete particles that will not alloy with the YSZ matrix 36 of the layers 32. Accordingly, the present invention differs from prior TBC materials sequentially deposited as discrete homogeneous layers or codeposited to form a mixture of two or more materials. As a result, the TBC 26 of this invention is characterized by improved resistance to both erosion and impact, yet can be present as a relatively thin coating (e.g., less than 125 micrometers) to improve engine performance, fuel efficiency and component life.

While the invention has been described in terms of a preferred embodiment, it is apparent that other forms could be adopted by one skilled in the art. For example, instead of depositing the TBC 26 by EBPVD or CVD-assisted PVD, other atomic and molecular vapor deposition processes could be used, such as sputtering, ion plasma deposition, and all forms of melting and evaporation deposition processes. Accordingly, the scope of the invention is to be limited only by the following claims.

What is claimed is:

1. A component having a multilayer thermal barrier coating on a surface thereof, the thermal barrier coating having at least one first layer of particle-free ceramic material alternating with at least one second layer of a ceramic matrix defined by the ceramic material and in which is dispersed at least 3 volume percent up to about 50 volume percent of chromia particles that are harder than the ceramic material and are insoluble in the ceramic material, wherein the at least one second layer consists of yttria-stabilized zirconia and the chromia particles.

2. A component according to claim 1, wherein the thermal barrier coating has a columnar microstructure.

3. A component according to claim 1, wherein the ceramic material of the first and second layers is yttria-stabilized zirconia.

4. A component according to claim 1, wherein the ceramic material of the first and second layers consists essentially of zirconia partially stabilized with about 3 to about 20 weight percent yttria.

5. A component according to claim 1, wherein the particles are present in the at least one second layer at levels of at least 10 to about 40 volume percent.

6. A component according to claim 1, wherein the particles have diameters in a range of about 100 to about 5000 nanometers.

7. A component according to claim 1, wherein the at least one second layer has a thickness of about 1 to about 50 micrometers.

8. A component according to claim 1, wherein the at least one first layer has a thickness greater than or equal to that of the at least one second layer.

9. A component according to claim 1, wherein the thermal barrier coating contains at least two of at least one of the first and second layers.

10. A component according to claim 1, wherein the at least one second layer constitutes about 20 volume percent to about 80 volume percent of the thermal barrier coating.

11. A gas turbine engine component comprising:
a superalloy substrate;
a metallic bond coat on a surface of the substrate; and
a columnar thermal barrier coating on the bond coat, the thermal barrier coating having first layers of particle-free yttria-stabilized zirconia alternating with second layers of a ceramic matrix formed of yttria-stabilized zirconia and in which is dispersed at least 3 volume percent and not more than 50 volume percent of alumina and/or chromia particles, the second layers constituting about 20 volume percent to about 80 volume percent of the thermal barrier coating.

12. A gas turbine engine component according to claim wherein the yttria-stabilized zirconia of the first and second layers consists essentially of zirconia partially stabilized with 3 to 20 weight percent yttria.

13. A gas turbine engine component according to claim 11, wherein the second layers of the thermal barrier coating consist of yttria-stabilized zirconia and at least 10 to about 40 volume percent alumina particles having diameters in a range of about 100 to about 5000 nanometers.

14. A gas turbine engine component according to claim 11, wherein the second layers of the thermal barrier coating consist of yttria-stabilized zirconia and at least 10 to about 40 volume percent chromia particles having diameters in a range of about 100 to about 5000 nanometers.

15. A gas turbine engine component according to claim 11, wherein the component has a first surface region relatively more prone to erosion and impact damage than a second surface region of the component, and the thermal barrier coating is deposited on the first surface region and not on the second surface region.

16. A component having a multilayer thermal barrier coating on a surface thereof, the thermal barrier coating having multiple particle-free first layers of a first ceramic material alternating with multiple second layers of a ceramic matrix defined by the first ceramic material and in which is dispersed at least 10 volume percent up to about 40 volume percent of particles of a second ceramic material that is harder than the first ceramic material and is insoluble in the first ceramic material.

17. A component having a multilayer thermal barrier coating on a surface thereof, the thermal barrier coating having multiple particle-free first layers of a first ceramic material alternating with multiple second layers of a ceramic matrix defined by the first ceramic material and in which is dispersed at least 3 volume percent up to about 50 volume percent of particles of a second ceramic material that is harder than the first ceramic material and is insoluble in the first ceramic material, the particles having diameters in a range of about 100 to about 5000 nanometers, the second layers constituting about 20 volume percent to about 80 volume percent of the thermal barrier coating.

* * * * *